United States Patent
Sjöland

(10) Patent No.: US 11,902,410 B2
(45) Date of Patent: Feb. 13, 2024

(54) PHASE LOCKED LOOP CIRCUIT WITH INCREASED ROBUSTNESS

(71) Applicant: Telefonaktiebolaget LM Ericsson (publ), Stockholm (SE)

(72) Inventor: Henrik Sjöland, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 26 days.

(21) Appl. No.: 17/792,772

(22) PCT Filed: Jan. 21, 2020

(86) PCT No.: PCT/SE2020/050050
§ 371 (c)(1),
(2) Date: Jul. 14, 2022

(87) PCT Pub. No.: WO2021/150150
PCT Pub. Date: Jul. 29, 2021

(65) Prior Publication Data
US 2023/0046659 A1 Feb. 16, 2023

(51) Int. Cl.
*H04L 7/033* (2006.01)
*H03L 7/093* (2006.01)
*H03L 7/099* (2006.01)

(52) U.S. Cl.
CPC ............ *H04L 7/0331* (2013.01); *H03L 7/093* (2013.01); *H03L 7/0991* (2013.01)

(58) Field of Classification Search
CPC ...... H04L 7/0331; H03L 7/093; H03L 7/0991
See application file for complete search history.

(56) References Cited

U.S. PATENT DOCUMENTS

| 6,603,362 B2 | 8/2003 | Von Dolteren, Jr. |
| 2002/0084856 A1 | 7/2002 | Von Dolteren, Jr. |

(Continued)

FOREIGN PATENT DOCUMENTS

WO    WO 2018/124506 A1    7/2018

OTHER PUBLICATIONS

International Search Report and Written Opinion of the International Searching Authority, PCT/SE2020/050050, dated Sep. 22, 2020, 10 pages.

(Continued)

*Primary Examiner* — Freshteh N Aghdam

(74) *Attorney, Agent, or Firm* — Sage Patent Group

(57) ABSTRACT

A Phase Locked Loop PLL circuit and method therein for generating multiphase output signals are disclosed. The PLL circuit includes a digitally controlled oscillator, a sample circuit, an analog to digital converter and a digital processing unit. The digital processing unit comprises a phase estimator configured to estimate a phase of the multiphase output signals, a differentiator configured to calculate a phase difference between a current phase and a previous phase, and an accumulator configured to accumulate the phase differences generated by the differentiator. The PLL circuit further comprises a loop filter configured to receive an output from the accumulator and generate a control signal (Continued)

to the digitally controlled oscillator to adjust frequency of the digitally controlled oscillator generating the multiphase output signals.

15 Claims, 6 Drawing Sheets

(56) References Cited

U.S. PATENT DOCUMENTS

| | | | |
|---|---|---|---|
| 2006/0033582 A1* | 2/2006 | Staszewski | H03L 7/085 |
| | | | 331/16 |
| 2009/0141845 A1 | 6/2009 | Ballantyne et al. | |
| 2010/0117742 A1* | 5/2010 | Da Dalt | H03L 7/087 |
| | | | 331/18 |
| 2010/0117743 A1* | 5/2010 | Da Dalt | H03L 7/16 |
| | | | 331/18 |
| 2011/0133795 A1* | 6/2011 | Kim | H03L 7/1806 |
| | | | 327/156 |
| 2014/0077904 A1 | 3/2014 | Huynh | |
| 2019/0356223 A1 | 11/2019 | Jenkins | |
| 2019/0356323 A1* | 11/2019 | Jenkins | H03L 7/0994 |
| 2021/0013890 A1* | 1/2021 | Lachartre | H03L 7/1806 |
| 2022/0060191 A1* | 2/2022 | Roodnat | H03L 7/091 |

OTHER PUBLICATIONS

Dong, L., et al,, "A 2.4-GHz 16-Phase Sub-Sampling Fractional-N PLL With Robust Soft Loop Switching," IEEE Journal of Solid-State Circuits, vol. 53, No. 3, Mar. 2018, 13 pages.

Markulic, N., "A DTC-Based Subsampling PLL Capable of Self-Calibrated Fractional Synthesis and Two-Point Modulation," IEEE Journal of Solid-State Circuits, vol. 51, No. 12, Dec. 2016, 15 pages.

Vajpayee, V.et al., A Frequency Demodulator Based on Adaptive Sampling Frequency Phase-Locking Scheme for Large Deviation FM Signals, Circuits, Systems, and Signal Processing (2019) 38:1717-1735 https://doi.org/10.1007/s00034-018-0933-2, 19 pages.

Extended European Search Report, European Patent Application No. 20916171.0, dated Sep. 18, 2023, 6 pages.

Liu, M., et al., "A 5-GHz Low-Power Low-Noise Integer-N Digital Subsampling PLL With SAR ADC PD," IEEE Transactions on Microwave Theory and Techniques, IEEE, USA, vol. 66, No. 9, Sep. 1, 2018, (XP011689776) pp. 4078-4087.

* cited by examiner

PHASE LOCKED LOOP CIRCUIT WITH INCREASED ROBUSTNESS

CROSS REFERENCE TO RELATED APPLICATIONS

This application is a 35 U.S.C. § 371 national stage application of PCT International Application No. PCT/SE2020/050050 filed on Jan. 21, 2020, the disclosure and content of which is incorporated by reference herein in its entirety.

TECHNICAL FIELD

Embodiments herein relate to a Phase Locked Loop (PLL) circuit. In particular, they relate to a PLL circuit with multiphase output signals where the multiphase output signals are subsampled to detect the phase of the output signals, as well as electronic devices, such as receivers, transmitters and transceivers comprising the PLL circuit.

BACKGROUND

There is a need for accurate local oscillator (LO) signals in wireless transceivers. Typically, LO signals are generated using phase locked loops (PLLs). Traditionally analog PLLs have been used, but lately also digital ones. Currently both options are viable, with different pros and cons. A digital PLL has advantages in the absence of an analog loop filter with large area capacitors, and possibility to support advanced digital algorithms to, for instance, speed up frequency hops. An analog PLL on the other hand is much less complex to design and may have excellent performance regarding phase noise. For instance, at very high frequencies or for very low power, the simplicity of an analog PLL makes it an excellent choice. Choosing an analog PLL, however, the possibilities of using digital algorithms to achieve improved performance may be sacrificed.

Regardless of using an analog or digital PLL, a key concern is how to achieve sufficiently low phase noise with limited power consumption and chip area, without sacrificing any other aspect. While traditional PLL architectures using phase-frequency detectors and charge pumps are well proven in applications, the highest performance in terms of phase noise versus power consumption is achieved in recent publications using subsampling phase detectors, e.g. N. Markulic et. al. "A DTC-Based Subsampling PLL Capable of Self-Calibrated Fractional Synthesis and Two-Point Modulation", *IEEE Journal of Solid-State Circuits*, pp. 3078-3092, vol. 51, no. 12, December 2016. Subsampling can be used in both analog and digital PLLs.

While subsampling phase detectors achieve the highest phase noise versus power performance in published works, analysis indicates that robustness to interference is sacrificed. That may be a serious concern in some practical applications. If the PLL is sensitive to interference and prone to losing lock, it may be a poor choice in applications requiring high reliability or when interference is hard to control, such as in a transceiver chip for cellular communications supporting multiple antennas and frequency bands.

SUMMARY

Therefor it is an object of embodiments herein to provide a Phase Locked Loop (PLL) circuit with increased robustness to interference.

According to one aspect of embodiments herein, the object is achieved by a Phase Locked Loop (PLL) circuit for generating multiphase output signals. The PLL circuit comprises a digitally controlled oscillator for generating the multiphase output signals; a sample circuit configured to sample the multiphase output signals from the digital controlled oscillator, an analog to digital converter for converting the sampled multiphase output signals to digital samples and a digital processing unit. The digital processing unit comprises a phase estimator configured to estimate a phase of the multiphase output signals from the digital samples, a differentiator configured to calculate a phase difference between a current phase and a previous phase, and an accumulator configured to accumulate the phase differences generated by the differentiator. The PLL circuit further comprises a loop filter configured to receive an output from the accumulator and generate a control signal to the digitally controlled oscillator to adjust the frequency of the digitally controlled oscillator generating the multiphase output signals.

According to one aspect of embodiments herein, the object is achieved by a method performed in a Phase Locked Loop (PLL) circuit for generating multiphase output signals. The PLL circuit generates the multiphase output signals in a digitally controlled oscillator, samples the multiphase output signals from the digital controlled oscillator in a sample circuit, converts the sampled multiphase output signals to digital samples in an analog to digital converter. The PLL circuit estimates a phase of the multiphase output signals from the digital samples in a phase estimator, calculates a phase difference between a current phase and a previous phase in a differentiator, and accumulates the phase differences generated by the differentiator in an accumulator. The PLL circuit further generates a control signal in a loop filter receiving an output from the accumulator and adjusts the frequency of the digitally controlled oscillator generating the multiphase output signals.

The embodiments herein provide a PLL circuitry with multiphase output signals. The multiphase output signals are subsampled and then converted to digital samples. The digital samples are used to estimate the phase of the output signals. The phase difference is calculated between the current phase and the previous phase, yielding a phase difference in the interval between −180 degrees and +180 degrees. And then this phase difference is added to the current value of the accumulator, after which it is stored as the new accumulated phase value. The accumulated phase is then sign reversed to obtain negative feedback, and fed to the loop filter for generating a control signal to adjust the frequency of the oscillator generating the multiphase output signals. In this way, information about the phase of the output signals is provided, regardless of where on the waveform of the output signals the sample is taken. By differentiating and accumulating the phase samples, the phase detection range may be unlimited. This prevents the subsampling PLL from losing lock due to small bandwidth, as large phase errors may be handled in locked state. This is in contrast to regular subsampling PLLs, where the sample must be taken on the proper waveform edge of a signal to provide useful information. If the sample is taken outside the edge the result will not be responsive to phase changes, and if it is taken on the wrong edge, the polarity of the phase detector gain will be reversed, making the PLL unstable.

The property of being able to detect the phase by sampling anywhere on the waveform is used to make the PLL operation more robust. The PLL circuit according to embodiments herein is much more robust to interference, and may tolerate up to 100 times higher oscillator pushing without losing lock compared to the regular subsampling PLLs. The added hardware for this is very limited, since the multiphase signal, such as a quadrature signal, is often used in wireless communication applications.

Therefore, the embodiments herein provide a PLL circuit with increased robustness to interference with simple circuitry and calculations.

BRIEF DESCRIPTION OF THE DRAWINGS

Examples of embodiments herein are described in more detail with reference to attached drawings in which.

DETAILED DESCRIPTION

Figure 1:
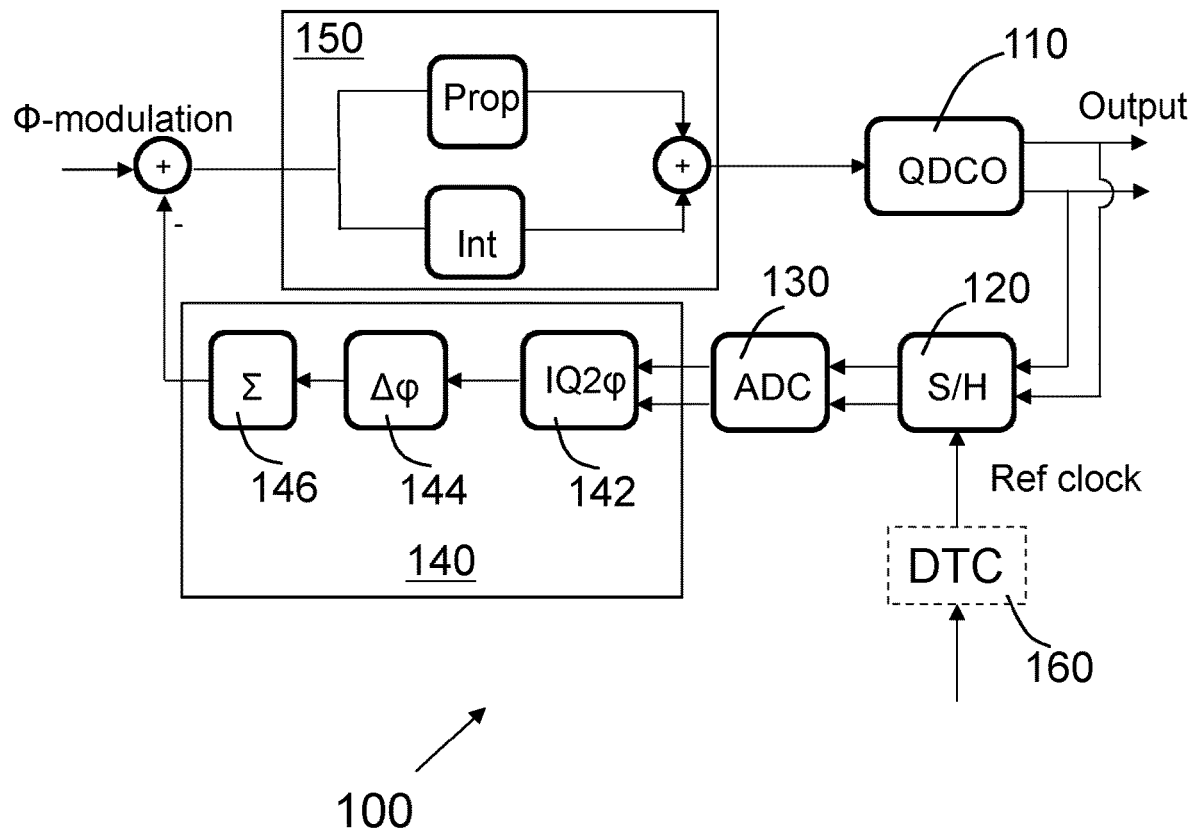
FIG. 1 is a schematic block view of a PLL circuit according to embodiments herein.

FIG. 1 shows a schematic block view of a PLL circuit 100 according to embodiments herein. The PLL circuit 100 is configured to generate multiphase output signals, e.g. quadrature signals. The PLL circuit 100 comprises a digitally controlled oscillator (DCO), e.g. a quadrature DCO QDCO 110 for generating the multiphase output signals.

The PLL circuit 100 further comprises a sample circuit S/H 120 configured to sample the multiphase output signals from the digitally controlled oscillator QDCO 110.

The PLL circuit 100 further comprises an analog to digital converter ADC 130 for converting the sampled multiphase output signals to digital samples.

The PLL circuit 100 further comprises a digital processing unit 140 for processing the digital samples.

The digital processing unit 140 comprises a phase estimator IQ2φ 142 configured to estimate a phase φ (n) of the multiphase output signals from the digital samples of the multiphase output signals, where n represents a series number for a current digital samples.

The digital processing unit 140 further comprises a differentiator Δφ 144 configured to calculate a phase difference between a current phase and a previous phase estimated by the phase estimator IQ2φ142, i.e. Δφ(n)=φ(n)−φ (n−1). The phase difference should be output in the range −180 degrees to +180 degrees. If a calculated phase difference is outside the range, e.g. larger than +180 degrees, 360 degrees is subtracted from the calculated phase difference. If instead a calculated phase difference is below −180 degrees, 360 degrees is added to the calculated phase difference. This will ensure that the output from the differentiator is always in the range −180 degrees to +180 degrees.

The digital processing unit 140 further comprises an accumulator Σ 146 configured to accumulate the phase differences generated by the differentiator Δφ 144. That is, at each time instant n when a phase difference Δφ(n) is calculated by the differentiator Δφ 144, the phase difference Δφ(n) is added to the previous value of the accumulator, to get a current accumulator value, which may be expressed by α(n)=a (n−1)+Δφ(n), where α(n) is the current accumulator value and α(n−1) is the previous accumulator value.

The PLL circuit 100 further comprises a loop filter 150 configured to receive an output from the accumulator Σ 146 and generate a control signal to the digitally controlled oscillator 110 to adjust frequency of the digitally controlled oscillator QDCO 110 generating the multiphase output signals.

Although the PLL circuit 100 according to the embodiments herein as shown in FIG. 1 includes a quadrature digitally controlled oscillator QDCO 110 which generates quadrature output signals, i.e. 4-phase output signals, it may alternatively be any digitally controlled oscillator generating output signals with a different number of phases than 4, for instance 3 or 5. Since quadrature signals are often used in transceivers, that case is the one that is illustrated in FIG. 1.

In the following, the function of the PLL circuit 100 will be explained and described in detail. The QDCO 110 receives a control signal, i.e. a digital frequency control word from the digital loop filter 150, which may have a proportional path Prop and an integral path Int. The gain in the two paths may be controlled independently to set both the PLL bandwidth and loop filter zero location. The output signals from QDCO 110 are subsampled in the sample and hold circuit S/H 120 at a sampling frequency set by a reference clock. It is important that the output signals from the QDCO 110 are such that at all times at least one signal has a non-zero derivative, that means at all times the sampled result of at least one signal changes if the sampling time (phase) is slightly changed so that no dead-zones exist where the same sampled output is provided for a range of sampling times, and that by observing the signals at any instance in time, a non-ambiguous phase estimation of the oscillator output signals may be made in an interval of one oscillator period. A quadrature oscillator producing sine-wave signals has that property, since mapping the In-phase and Quadrature-phase (IQ) output signals to a Cartesian coordinate system, the signal will be located on a circle and moving uniformly with time in the Cartesian plane, and the phase of the oscillator output signals can be obtained directly by a Cartesian to polar coordinate conversion.

After the output signals from QDCO 110 have been sampled, they are converted to digital samples by the ADC 130.

The phase estimator IQ2φ 142 then calculates the phase from the digitized IQ samples. Basically, it performs a Cartesian to polar coordinate transformation of the digitized IQ samples, without calculating the polar amplitude coordinate. This may be performed in many different ways, using arcsin and arccos functions on one of the IQ output signals, or using the arctan function on the ratio of I and Q output signals. Regardless, to cover the full 360 degree range, the range needs to be split up depending on signs and possibly magnitudes of I and Q output signals, since the arcsin, arccos and arctan functions only cover 180 degrees. The functions may be evaluated in different ways using tables or polynomials. An alternative is to use a look-up table directly providing a phase estimate from I and Q output signals.

Therefore according to some embodiments herein, the phase estimator may be configured to estimate the phase of the multiphase output signals by performing transformation from Cartesian to polar coordinates for the digital samples of the multiphase output signals, or by using a look-up table.

After the phase estimator IQ2φ 142, comes the differentiator Δφ 144. The differentiator Δφ 144 calculates a phase difference from the last digital sample. The result is a phase difference between −180 to +180 degrees, i.e. the phase has advanced or retarded by up to half a cycle of the oscillator. The accumulator Σ 146 following the differentiator Δφ 144 is a summation. Several consecutive phase differences with the same sign, corresponding to a frequency deviation being positive or negative over a time interval, can add up to a phase of several cycles. Without the phase differentiator and accumulator this would not be possible, and the phase would then wrap around rather than build up, and the PLL would lose lock.

Assume for illustration that the output frequency is first at an integer multiple of the reference clock, the PLL is locked and the phase is zero, the value in the accumulator is zero. Then at a time 3 reference cycles from when the observation starts, a disturbance occurs so that the frequency of the oscillator increases by an offset frequency of 0.2 times the reference frequency. The sampled signal then has a phase that increases by 0.2*360 degrees=72 degrees for every sample. It is assumed that the PLL has a low bandwidth and it will take some time before the frequency of the oscillator changes. The values in the phase estimator IQ2φ, the differentiator Δφ and the accumulator Σ for the initial part of the event are presented in the table below:

| Time (ref cycles) | IQ2φ (degrees) | Δφ (degrees) | Σ (degrees) |
| --- | --- | --- | --- |
| 0 | 0 | 0 | 0 |
| 1 | 0 | 0 | 0 |
| 2 | 0 | 0 | 0 |
| 3 | 0 | 0 | 0 |
| 4 | 72 | 72 | 72 |
| 5 | 144 | 72 | 144 |
| 6 | 216 | 72 | 216 |
| 7 | 288 | 72 | 288 |
| 8 | 0 | 72 | 360 |
| 9 | 72 | 72 | 432 |
| 10 | 144 | 72 | 504 |
| 11 | 216 | 72 | 576 |

As can be seen the phase differentiator produces an output of 72 degrees from the time 4 reference cycles and on. The accumulator then sums up the phase differences producing a linearly growing phase error, a ramp, consistent with a constant frequency error. The output of the phase estimator IQ2φ, however, starts by producing the same value as the accumulator at the time 4 reference cycles, but at the time 8 reference cycles it wraps around, and starts over at 0. This is because the range of the phase, when calculated from a single sample, is limited to between 0 and 360 degrees. By introducing the Δφ and Σ blocks instead of using the value from IQ2φ directly, this limitation is circumvented leading to significant improvement in PLL performance.

The accumulated phase value is then sign reversed to obtain negative feedback, and fed to the loop filter 150 for generating a control signal to adjust the frequency of the digitally controlled oscillator generating the multiphase output signals, until the PLL is locked and the accumulated phase value approaches to a target phase value, e.g. a desired modulation phase φ-modulation.

Before the loop filter 150 a phase modulation signal may also be added, to facilitate phase modulation, or fractional-N operation. So the loop filter 150 may be configured to further receive a signal with a modulation phase together with the output from the accumulator 146. An alternative to that is to use time manipulation of the sampling reference clock for that purpose, which is a common method in regular subsampling PLLs, where a digital to time converter (DTC) may then be connected to the reference clock, as shown in FIG. 1, where a DTC 160 block with dotted line is connected to the sample circuit 120.

In order to show improved performance and advantages of the PLL circuit 100 according to embodiments herein, simulations have been performed for both the PLL circuit 100 and a regular subsampling PLL. Both PLLs have a loop filter with a proportional part and an integral path. The reference frequency was 100 MHz. The gain of the proportional path is set for a 1 MHz bandwidth, and the integral path gain is then set for a zero located at 65 kHz.

Figure 2:
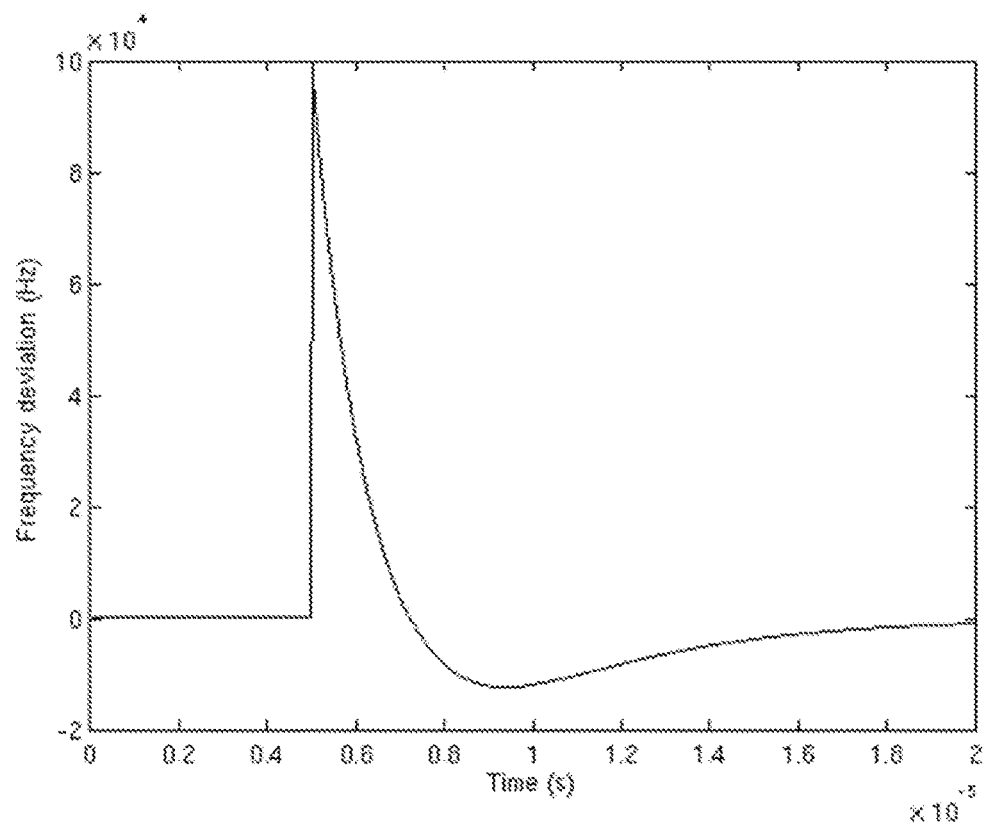
FIG. 2 is a diagram showing a step response of a regular subsampling PLL with frequency deviation step of 100 kHz.

First the regular subsampling PLL is simulated to see the performance. The frequency response when the oscillator center frequency is abruptly changed by 100 kHz is shown in FIG. 2. This is well below the 500 kHz predicted by a back-of-the-envelope calculation for losing lock, and a well-behaved response is observed as expected.

Figure 3:
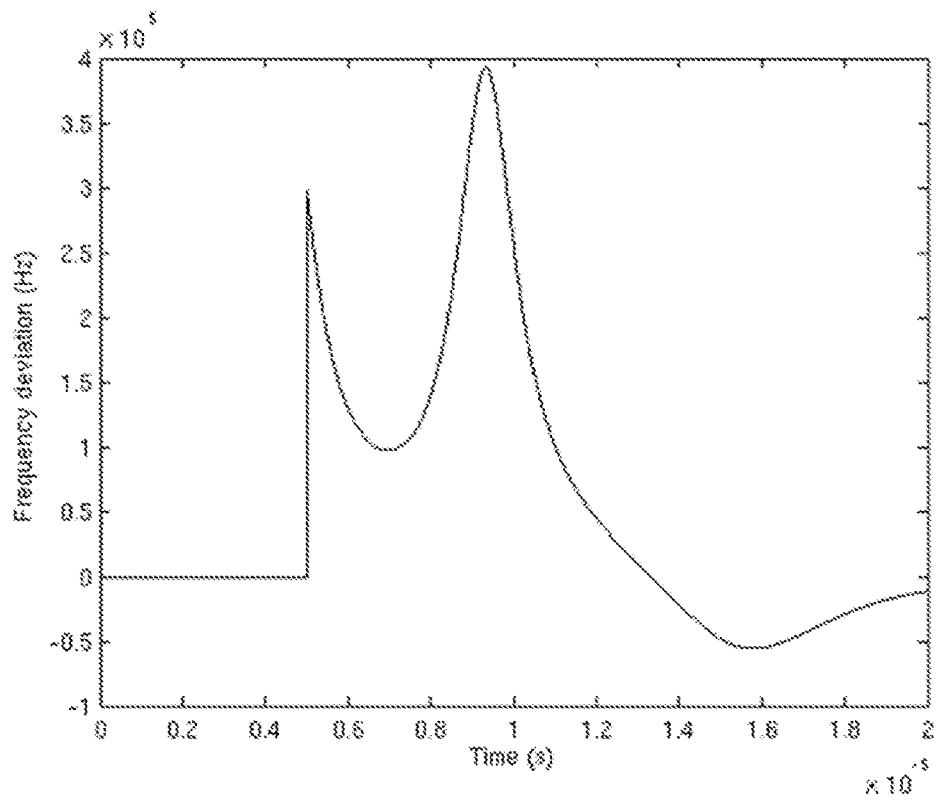
FIG. 3 is a diagram showing a step response of a regular subsampling PLL with frequency deviation step of 300 kHz.

With a larger frequency deviation step of 300 kHz, a bit less than predicted, the problem starts, and the shape of the step response deviates significantly from the well-behaved shape seen in FIG. 2, as shown in FIG. 3.

Figure 4:
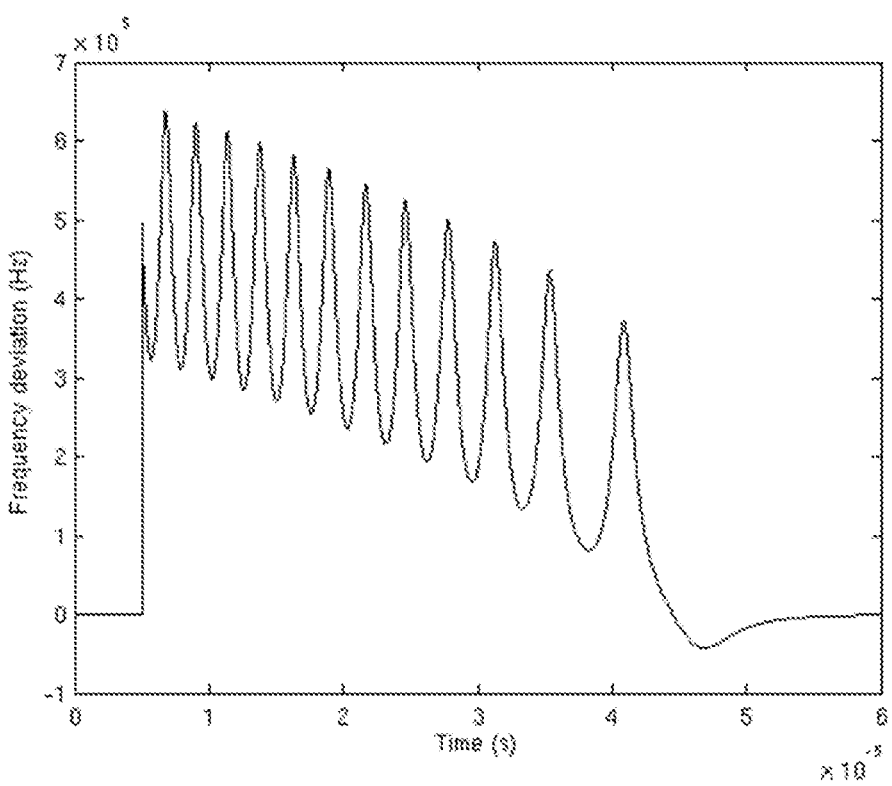
FIG. 4 is a diagram showing a step response of a regular subsampling PLL with frequency deviation step of 500 kHz.

When the frequency deviation step is 500 kHz, where problems are predicted by the back-of-the-envelope calculation, the lock is lost and it takes about 40 μs for the PLL to again acquire lock, as shown in FIG. 4.

Figure 5:
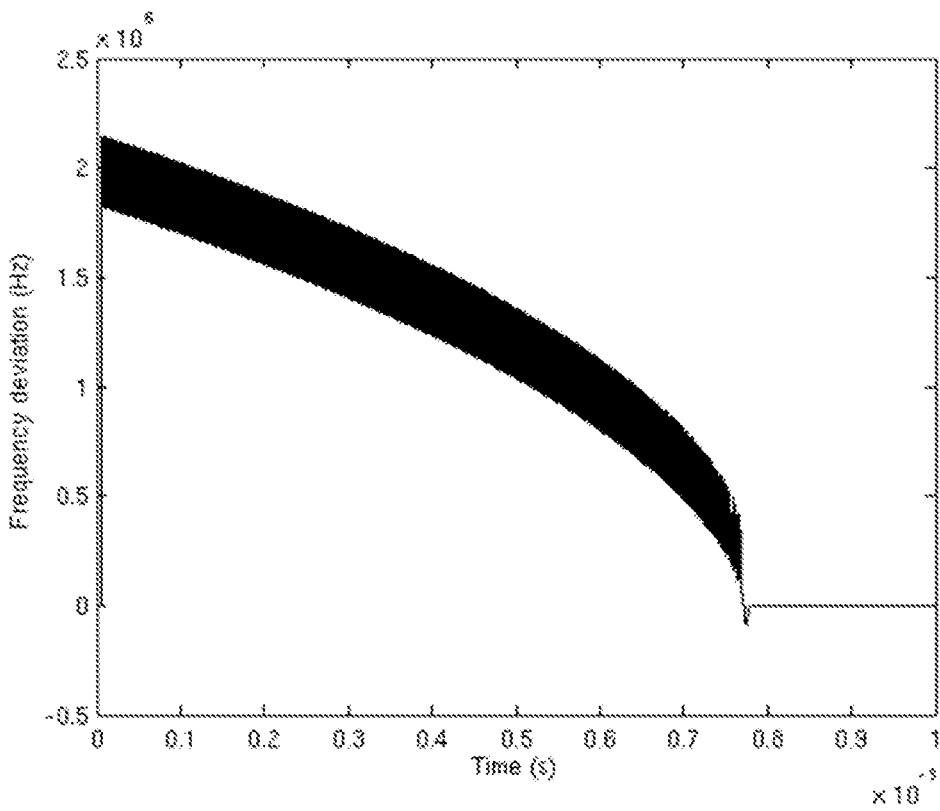
FIG. 5 is a diagram showing a step response of a regular subsampling PLL with frequency deviation step of 2 MHz.

The larger the frequency deviation step, the longer it takes for the PLL to re-lock. FIG. 5 shows when the frequency deviation step is 2 MHz, i.e. just 100 ppm on a 20 GHz PLL output, and the re-locking takes 0.7 ms. This is an extremely long time in wireless communication applications, during which communication using the signal from the PLL will be prevented.

Figure 6:
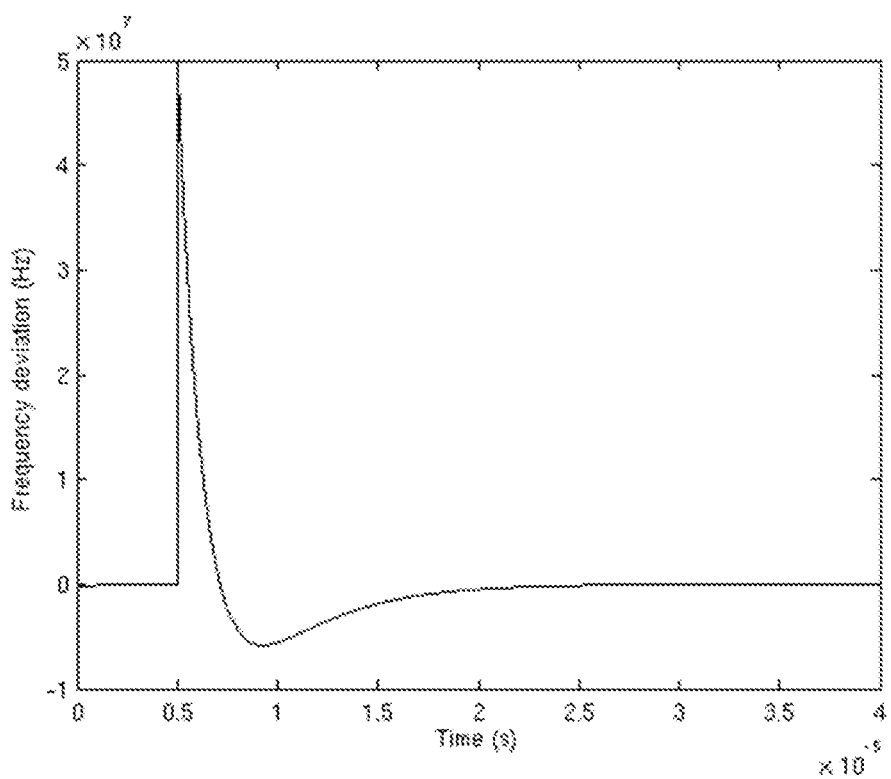
FIG. 6 is a diagram showing a step response of a PLL circuit according to embodiments herein with frequency deviation step of 50 MHz.

The PLL circuit 100 according to the embodiments herein is then simulated. A large frequency deviation step of 50 MHz is introduced, which is at the limit, i.e. at half of the reference frequency. The step response shape is close to that of the 100 kHz deviation step of the conventional subsampling PLL, i.e. almost ideal despite the large deviation step, as shown in FIG. 6. The I and Q output signals are in this case quantized by a 6-bit ADC, operating at a sampling rate of 100 MS/s.

Figure 7:
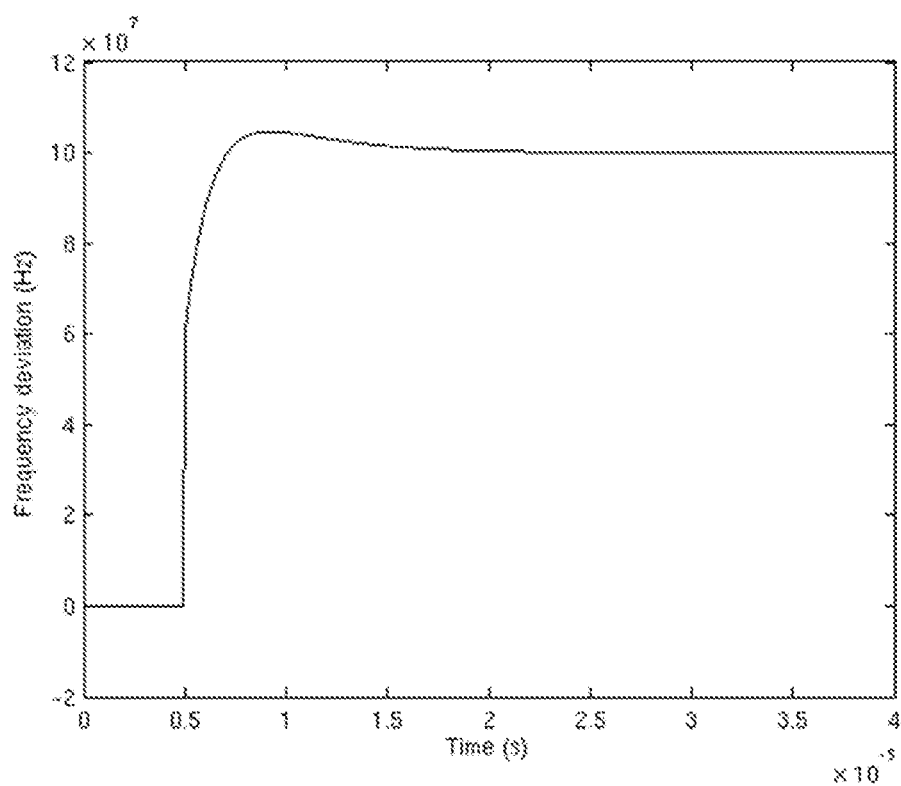
FIG. 7 is a diagram showing a step response of a PLL circuit according to embodiments herein with frequency deviation step of 60 MHz.

When an even larger frequency deviation step is introduced, e.g. 60 MHz, however, as shown in FIG. 7, the PLL will lock to a different harmonic frequency of the reference signal. So the false-lock problem of a conventional subsampling PLL still remains, but the PLL circuit 100 may handle disturbances all the way up to the limit of a false lock, i.e. half of the reference frequency, which is a major improvement.

Figure 8:
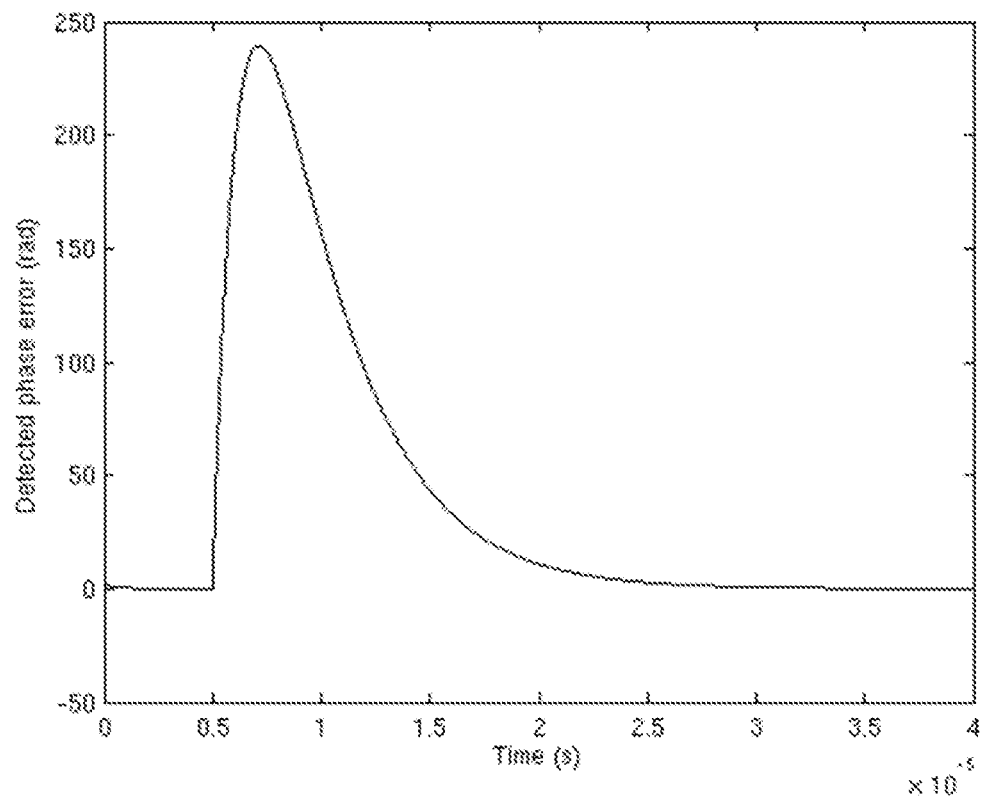
FIG. 8 is a diagram showing detected phase error of a PLL circuit according to embodiments herein with frequency deviation step of 50 MHz.

To bring some more insight into the unlimited phase range detection with the PLL circuit 100 according to embodiments herein, the detected phase error, i.e. the output by the accumulator, for the frequency deviation step of 50 MHz is shown in FIG. 8. In this case, the phase error peaks at 240 radians, corresponding to 38 oscillator cycles. This large phase detection range is needed not to lose lock in a PLL that directly subsamples the output signals.

By sampling the oscillator output signals at regular time intervals, oscillator frequency deviations up to half of the sampling frequency may be detected, with correct magnitude and sign. The correct sign means it is possible to detect if the frequency is too high or too low. As long as the oscillator frequency is within an interval of the target frequency plus minus half the sampling frequency, the sampled values will provide correct information about the oscillator phase and frequency. The PLL circuit 100 uses this information for increased performance. Specifically, the PLL circuit 100 can calculate the phase change from previous to current samples, ranging between −180 to +180 degrees, and then add this value to the phase value in the accumulator, and store the result in the accumulator. Since the digital accumulator is used to provide output phase value, it has in practice no limit. If instead an analog output signal is used, either current or voltage, there would be a limit to the maximum output signal level. If then the input range is increased, the gain must be reduced not to exceed the maximum output level. In the PLL circuit 100 according to the embodiments herein, that is not necessary, so there is no compromise in this respect. Therefore the PLL circuit 100 according to the embodiments herein provides a phase detection without limits, i.e. it can detect phase differences of multiple cycles, without compromising phase detection gain or involving complex circuitry. The calculations may most conveniently be performed in the digital domain, and the PLL circuit 100 is of a digital type. Without this technique, a limited phase detection range is associated with cycle-slips reducing PLL settling speed.

As the example simulated above, a PLL with 20 GHz output and 1 MHz bandwidth, at 100 MHz sampling frequency, the maximum frequency error may be handled by the PLL circuit 100 according to embodiments herein is +/−50 MHz, i.e. half of the sampling frequency. This corresponds to a 2500 ppm error of the 20 GHz output. In a regular subsampling PLL, on the other hand, the limitation will be set by the limited PLL bandwidth and the limited range of the phase detector. A back-of-the-envelope calculation is that it takes the PLL with 1 MHz bandwidth about 1 μs to react to a frequency change, i.e. the inverse of the bandwidth 1/1 MHz=1 μs. During that time the frequency error integrates to a phase error, which should not exceed 180 degrees, in order not to enter the region where the sign of the phase detector gain is reversed. If this limit is exceeded the PLL will lose lock, and it may take considerable time before lock is again acquired, during which the PLL output signal is not good enough for use in a cellular transceiver. 180 degrees in 1 μs corresponds to 0.5 MHz, so the frequency error should not exceed 0.5 MHz. This is just 1% of the frequency error that the PLL circuit 100 according to embodiments herein can handle, in this case just 25 ppm instead of 2500 ppm. Disturbances in the oscillation frequency may have different sources. For instance, the supply voltage may change abruptly, or the temperature of the oscillator. A frequency error tolerance of just 25 ppm seems risky. The improvement factor of the technique according to the embodiments herein is approximately equal to the ratio of the sampling frequency to the PLL bandwidth, i.e. the proposed technique may improve the robustness by 100 times.

To summarize, some advantages of the PLL circuit 100 according to embodiments herein are listed below:
Robustness to frequency errors may increase 100 times compared to a regular subsampling PLL.
No reduction of phase detection gain.
Unlimited phase detection range.
Simple circuitry: a quadrature oscillator connected to samplers and ADCs
Quadrature signals are anyway needed in transceivers, no extra added hardware.
Very simple calculations to obtain phase, just add phase increments.
Suitable for digital PLLs, providing flexibility and small loop filter.

Figure 9:
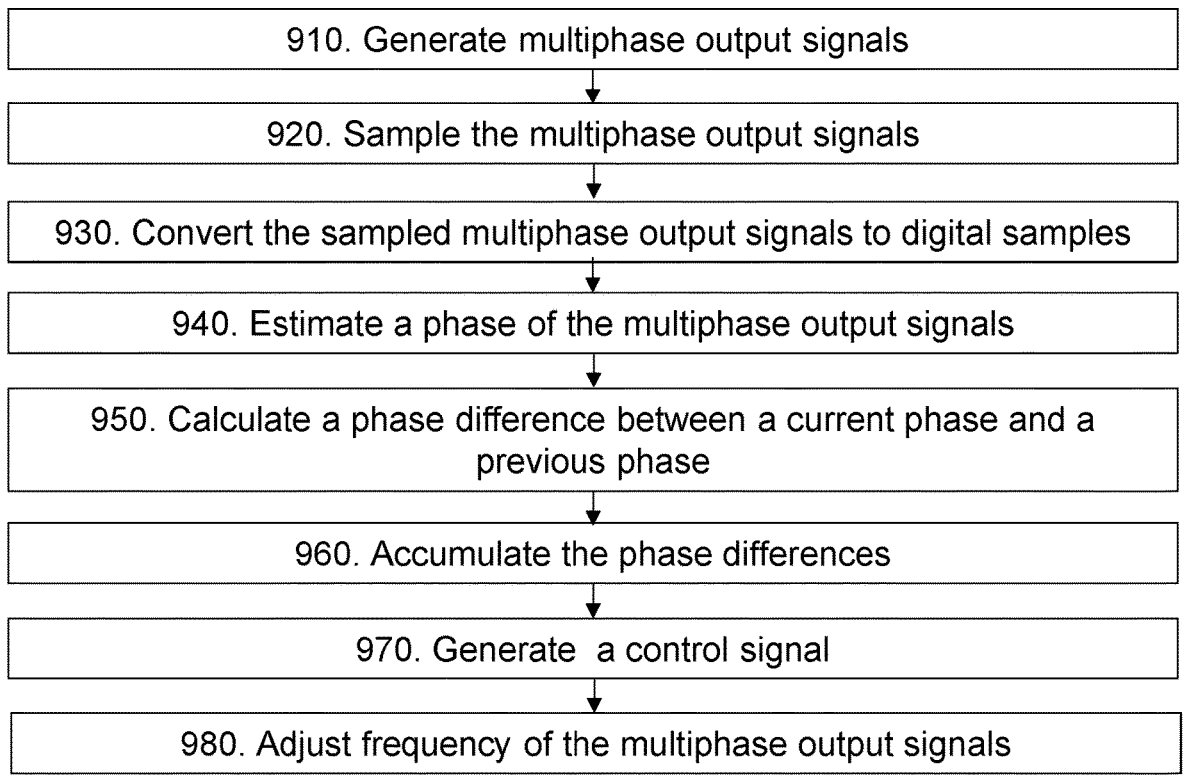
FIG. 9 is a flow chart illustrating a method performed in a PLL circuit according to embodiments herein.

A method performed in a PLL circuit 100 for generating multiphase output signals will be described with reference to FIG. 9. As shown in FIG. 1 and described above, the PLL circuit 100 comprises a digitally controlled oscillator 110, a sample circuit 120, an analog to digital converter 130, a digital processing unit 140 and a loop filter 150. The digital processing unit 140 comprises a phase estimator 142, a differentiator 144 and an accumulator (146). The method comprises the following actions.

Action 910
Generating the multiphase output signals in the digitally controlled oscillator 110.

Action 920
Sampling the multiphase output signals from the digital controlled oscillator (110) at a sampling frequency in the sample circuit 120.

Action 930
Converting the sampled multiphase output signals to digital samples in the analog to digital converter 130.

Action 940
Estimating a phase of the multiphase output signals from the digital samples in the phase estimator 142.

Action 950
Calculating a phase difference between a current phase and a previous phase in the differentiator 144.

Action 960
Accumulating the phase differences generated by the differentiator 144 in the accumulator 146.

Action 970
Generating a control signal to the digitally controlled oscillator in the loop filter 150. The loop filter 150 receives an output from the accumulator 146.

Action 980
Adjusting frequency of the digitally controlled oscillator 110 generating the multiphase output signals.

Figure 10:
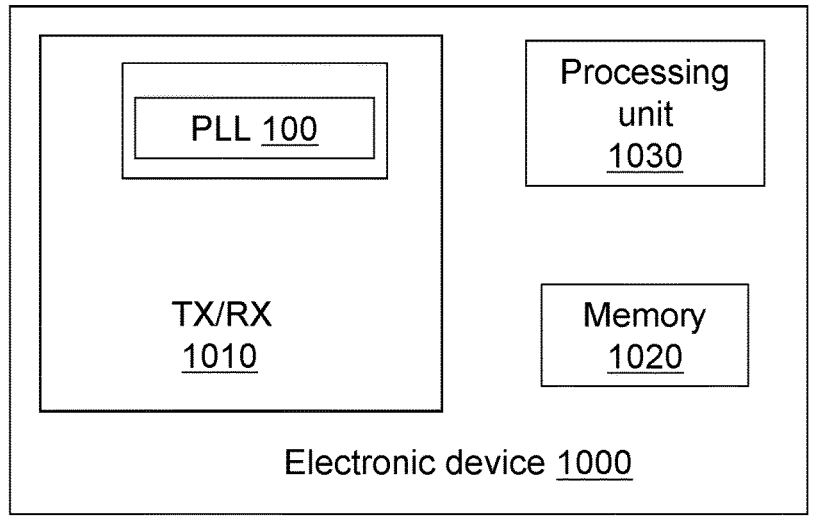
FIG. 10 is a block diagram illustrating an electronic device in which a PLL circuit according to embodiments herein may be implemented.

The PLL circuit 100 may be employed in various integrated circuits, electronic circuits, communication devices or apparatus. FIG. 10 shows a block diagram for an electronic device 1000 in which a PLL circuit 100 according to embodiments herein may be implemented. The electronic device 1000 may comprise a receiver or a transmitter or both i.e. a transceiver TX/RX 1010 in which the PLL circuit 100 according to embodiments herein may be implemented. The electronic device 1000 may comprise other units, where a memory 1020, a processing unit 1030 are shown. The electronic device 1000 may be any one of a base station, a wireless communication device such as a user equipment or a mobile device for a cellular communication system.

Those skilled in the art will understand that the PLL circuit 100 according to embodiments herein may be implemented by any semiconductor technology, e.g. Bi-polar, NMOS, PMOS, CMOS or Micro-Electro-Mechanical Systems (MEMS) technology etc.

The word "comprise" or "comprising", when used herein, shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A Phase Locked Loop, PLL, circuit for generating multiphase output signals comprising:
   a digitally controlled oscillator for generating the multiphase output signals;
   a sample circuit configured to sample the multiphase output signals from the digital controlled oscillator;
   an analog to digital converter for converting the sampled multiphase output signals to digital samples;
   a digital processing unit comprising:
   a phase estimator configured to estimate a phase of the multiphase output signals from the digital samples;
   a differentiator configured to calculate a phase difference between a current phase and a previous phase; and
   an accumulator configured to accumulate the phase differences generated by the differentiator;
   the PLL circuit further comprises:
   a loop filter configured to receive an output from the accumulator and generate a control signal to the digitally controlled oscillator to adjust frequency of the digitally controlled oscillator generating the multiphase output signals.

2. The PLL circuit according to claim 1, wherein the sample circuit is configured to sample the multiphase output signals from the digitally controlled oscillator at regular time intervals and at a sampling frequency lower than the frequency of the digitally controlled oscillator such that oscillator frequency deviations up to half of the sampling frequency is unambiguously detected.

3. The PLL circuit according to claim 1, wherein the digitally controlled oscillator is a quadrature digitally controlled oscillator.

4. The PLL circuit according to claim 1, wherein the differentiator is configured to calculate a phase difference between a current phase and a previous phase in a range of −180 degrees to +180 degrees.

5. The PLL circuit according to claim 1, wherein the loop filter is further configured to receive a signal with a target phase to facilitate phase modulation.

6. The PLL circuit according to claim 1, wherein the phase estimator is configured to estimate a phase of the multiphase output signals by performing transformation from Cartesian to polar coordinates for the digital samples of the multiphase output signals.

7. The PLL circuit according to claim 1, wherein the phase estimator is configured to estimate a phase of the multiphase output signals by using a look-up table.

8. A transceiver comprising a PLL circuit according to claim 1.

9. An electronic device comprising a PLL circuit according to claim 1.

10. A method performed in a Phase Locked Loop, PLL, circuit for generating multiphase output signals comprising:
    generating the multiphase output signals in a digitally controlled oscillator;
    sampling the multiphase output signals from the digital controlled oscillator at a sampling frequency in a sample circuit;
    converting the sampled multiphase output signals to digital samples in an analog to digital converter;
    estimating a phase of the multiphase output signals from the digital samples in a phase estimator;
    calculating a phase difference between a current phase and a previous phase in a differentiator;
    accumulating the phase differences generated by the differentiator in an accumulator;
    generating a control signal to the digitally controlled oscillator in a loop filter receiving an output from the accumulator; and
    adjusting frequency of the digitally controlled oscillator generating the multiphase output signals.

11. The method according to claim 10, wherein the sampling frequency is lower than the frequency of the digitally controlled oscillator such that oscillator frequency deviations up to half of the sampling frequency are unambiguously detected.

12. The method according to claim 10, wherein the multiphase output signals are quadrature output signals.

13. The method according to claim 10, wherein the phase difference between a current phase and a previous phase is in a range of −180 degrees to +180 degrees.

14. The method according to claim 10, wherein estimating a phase of the multiphase output signals is performed by transforming the digital samples of the multiphase output signals from Cartesian to polar coordinates.

15. The method according to claim 10, wherein estimating a phase of the multiphase output signals is performed by using a look-up table.

* * * * *